United States Patent [19]

Iwase

[11] Patent Number: 4,818,784

[45] Date of Patent: Apr. 4, 1989

[54] INSULATING COATING LAYER FOR ELECTRONIC CIRCUIT BOARD, INSULATING COATING MATERIAL FOR ELECTRONIC CIRCUIT BOARD, AND METHOD FOR FORMING INSULATING COATING LAYER FOR ELECTRONIC CIRCUIT BOARD

[75] Inventor: Teruhiko Iwase, Kariya, Japan

[73] Assignee: Nippondenso Co., Ltd., Kariya, Japan

[21] Appl. No.: 40,998

[22] Filed: Apr. 22, 1987

[30] Foreign Application Priority Data

Apr. 28, 1986 [JP] Japan .................................. 61-99239
Aug. 9, 1986 [JP] Japan .................................. 61-187159
Oct. 31, 1986 [JP] Japan .................................. 61-261023

[51] Int. Cl.$^4$ .................................. C08K 5/02
[52] U.S. Cl. .................................. 524/463; 524/462
[58] Field of Search .................................. 524/463, 462

[56] References Cited

U.S. PATENT DOCUMENTS

| | | | |
|---|---|---|---|
| 2,718,511 | 9/1955 | Sprung et al. | 524/463 |
| 3,126,358 | 3/1964 | Lemmerich | 524/463 |
| 3,533,977 | 10/1970 | Read | 524/463 |
| 3,564,088 | 2/1971 | Woodell | 524/463 |
| 3,740,369 | 6/1973 | Proskow | 524/463 |
| 3,962,171 | 6/1976 | Robbins | 524/463 |

FOREIGN PATENT DOCUMENTS

| | | | |
|---|---|---|---|
| 0148017 | 1/1951 | Australia | 524/463 |
| 0488893 | 12/1952 | Canada | 524/463 |
| 195256-A | 9/1986 | European Pat. Off. | |
| 0189693 | 8/1986 | Japan. | |

*Primary Examiner*—Joseph L. Schofer
*Assistant Examiner*—J. M. Reddick
*Attorney, Agent, or Firm*—Cushman, Darby & Cushman

[57] ABSTRACT

The present invention relates to an insulating coating material for an electronic circuit board, an insulating coating layer for an electronic circuit board, and a method for forming such insulating coating layer, and the insulating coating material is a solution comprising a thermoplastic resin and a solvent containing a low boiling solvent, which solution can be prevented from dropping after its application onto the electronic circuit board, and the insulating coating layer is formed using the coating material on the surface of the electronic circuit board having edge portions thereon so that the coating thickness at the edge portions and that at the other portion than the edge portions are almost equal to each other, further, the method for forming such insulating coating layer is characterized by forming the coating layer using the above insulating coating material according to a spray method or a dipping method.

15 Claims, 4 Drawing Sheets

INSULATING COATING LAYER FOR ELECTRONIC CIRCUIT BOARD, INSULATING COATING MATERIAL FOR ELECTRONIC CIRCUIT BOARD, AND METHOD FOR FORMING INSULATING COATING LAYER FOR ELECTRONIC CIRCUIT BOARD

DETAILED DESCRIPTION OF THE INVENTION

Industrial Utilization Field

The present invention relates to an insulating coating layer for an electronic circuit board with elements mounted thereon and a method for forming same. More particularly, the present invention is concerned with an improvement of a coated state of edge portions having electroconductivity on the board.

Moreover, the present invention relates to an insulating coating material for an electronic circuit board and more particularly to an insulating coating material from an electronic circuit board for forming on the board an insulating coating layer having high water repellency, quick drying property, high edge coverability and high adhesion.

Further, the present invention relates to an improvement in a method for forming an insulating coating layer for an electronic circuit board and more particularly to a method for forming an insulating coating layer having high water repellency, quick drying property, high edge coverability and high adhesion for an electronic circuit board with elements mounted thereon.

Prior Art

In a control circuit board for an electronic control unit it is necessary that an insulating coating layer having water repellency be formed on the surface of the board after mounting of electronic elements to prevent dew condensation on the board surface which would cause water coating and short-circuiting. This necessity is high particularly in various automotive electronic control units because automobiles are used under severe outdoor environments.

Such materials as acrylic resins, epoxy resins and silicone resins have heretofore been used for the formation of insulating coating layers of this type. As the method of forming such insulating coating layers there has been known a dipping method or a spray method, using a relatively high boiling solvent such as toluene or xylene.

On the other hand, a large number of elements are mounted on an electronic circuit board by passing their lead wire portions through insertion holes formed in the board followed by soldering. Fore ends of the elements' lead wires are each projecting in the form of a pin as shown in FIG. 1. According to experiments and research done by the present inventors, even if a resin solvent for forming a coating layer 6 is applied to the pin portion to cover the whole of the pin by a dipping method or a spray method, as shown in FIG. 7, the solution applied to the edge portion of the pin is apt to flow off the edge portion in the course of volatilization of the solvent and drying, resulting in such a state as shown in FIG. 8. And it has become clear that the pin top is finally uncovered as shown in FIG. 9.

The occurrence of such defect may be avoided by thickening the coating layer 6, for example, by increasing the number of times the application is repeated. However, a thicker coating layer is apt to deteriorate productivity and induce an internal stress of the coating layer itself, thus causing solder crack at the soldered portion due to heat shock or crack of the coating layer itself due to heat shrinkage.

SUMMARY OF THE INVENTION

Objects of the Invention

The present invention has been accomplished in view of the above-mentioned background and it is an object of the invention to provide a coating layer capable of fulfilling an insulating function to a satisfactory extent even for edge portions having electroconductivity of such pin-like projections as referred to above, a method for forming same, as well as an almost transparent coating layer which is relatively strong against external physical forces, and a method for forming same.

It is another object of the present invention to provide an insulating coating material for forming on an electronic circuit board an insulating coating layer having high water repellency, quick drying property, high edge coverability and high adhesion, without the need of post-treatment, as well as a method for forming the insulating coating layer.

Features of the Invention

In order to achieve the above-mentioned objects of the present invention, an insulating coating layer for an electronic circuit board, according to the present invention, is characterized by being formed on an electronic circuit board with electronic elements mounted thereon and provided on the surface thereof with edge portions having electroconductivity, the coating thickness at the edge portions and that at the other portion than the edge portions being almost equal to each other.

A method for forming an insulating coating layer for an electronic circuit board, according to the present invention, is characterized in that a solution of a thermoplastic resin in a low boiling solvent capable of dissolving the thermoplastic resin is sprayed onto the surface of an electronic circuit board with electronic elements mounted thereon to form an insulating coating layer thereon in which the thickness at edge portions having electroconductivity on the circuit board and the thickness at the other portion than the edge portions are almost equal to each other.

An insulating coating layer for an electronic circuit board, according to the present invention, is characterized by being formed on an electronic circuit board with electronic elements mounted thereon and provided on the surface thereof with edge portions having electroconductivity, the coating thickness at the edge portions and that at the other portion than the edge portions being almost equal to each other, and the surface of the coating layer being generally flat.

A method for forming an insulating coating layer for an electronic circuit board, according to the present invention, is characterized by spraying a solution of a thermoplastic resin in a first low boiling solvent capable of dissolving the thermoplastic resin onto the surface of an electronic circuit board with electronic elements mounted thereon to form an insulating coating layer thereon in which the thickness at edge portions having electroconductivity on the circuit board and the thickness at the other portion than the edge portions are almost equal to each other, and subsequently holding the thus-coated circuit board in a vapor atmosphere of a second solvent capable of dissolving the said resin, for a predetermined time to thereby flatten the surface of the coating layer.

A method for forming an insulating coating layer for an electronic circuit board, according to the present invention, is characterized by spraying a solution of a thermoplastic resin in a low boiling solvent capable of dissolving the thermoplastic resin onto the surface of an electronic circuit board with electronic elements mounted thereon to form an insulating coating layer thereon in which the thickness at edge portions having electroconductivity on the circuit board and the thickness at the other portion than the edge portions are almost equal to each other, and subsequently heating the coating layer at a predetermined temperature for a predetermined time to soften and melt the coating layer and to thereby flatten the surface thereof.

Operation

According to the above means, since the insulating coating layer forming solution is constituted by a low boiling solvent, it has drying property and is applicable by a spray method, and when applied onto the board, it immediately becomes dry or semi-dry. Consequently, a uniform coating layer can be formed even at a portion where the solution is apt to flow away such as an edge portion, thus permitting the edge portion to be coated in an insulated state without the necessity of thickening the coating layer.

In this state the coating layer is white and dotlike-embossed and has a very high water repellency, but the white color makes it difficult to discriminate between electronic elements under the coating, and fine concaves and convexes on the coating surface weaken the coating layer against external physical forces such as manual contact. In the present invention, however, concaves and convexes on the coating layer surface are coating layer against external physical forces such as manual contact. In the present invention, however, concaves and convexes on the coating layer surface are melted to flatten to almost the same surface without causing flow of the coating layer, so that the coating layer becomes transparent in uniform thickness and strong against external physical forces.

An insulating coating material for an electronic circuit board, according to the present invention, is characterized in that it is a solution comprising a thermoplastic resin and a mixed solvent capable of dissolving the thermoplastic resin and that the said mixed solvent comprises a main solvent capable of dissolving the thermoplastic resin and having a boiling point not higher than 100° C. at 760 mmHg and a secondary solvent compatible with and boiling higher than the main solvent.

A method for forming an insulating coating layer for an electronic circuit board, according to the present invention, is characterized by applying a solution comprising a thermoplastic resin and a mixed solvent by spraying onto the surface of an electronic circuit board with electronic elements mounted thereon, the mixed solvent comprising a main solvent capable of dissolving the thermoplastic resin and having a boiling point not higher than 100° C. at 760 mmHg and a secondary solvent compatible with and boiling higher than the main solvent, and then drying the said solution to form an insulating coating layer on the board in which the thickness at edge portions having electroconductivity on the circuit board and the thickness at the other portion than the edge portions are almost equal to each other.

A method for forming an insulating coating layer for an electronic circuit board, according to the present invention, is characterized by dipping an electronic circuit board with electronic elements mounted thereon into a solution comprising a thermoplastic resin and a mixed solvent, the mixed solvent comprising a main solvent capable of dissolving the thermoplastic resin and having a boiling point not higher than 100° C. at 760 mmHg and a secondary solvent compatible with and boiling higher than the main solvent, then pulling up the electronic circuit board from the solution to apply the solution onto the surface of the circuit board, and subsequently drying the applied solution to form an insulating coating layer in which the thickness at edge portions having electroconductivity on the circuit board and the thickness at the other portion than the edge portions are almost equal to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

The following concrete examples are given to illustrate the present invention in more detail.

EXAMPLE 1

Figure 2:
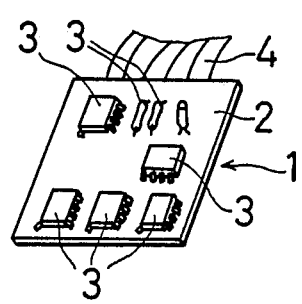
FIG. 2 is a perspective view showing an electronic circuit board with the insulating coating layer of FIG. 1 applied thereto.
Figure 3:
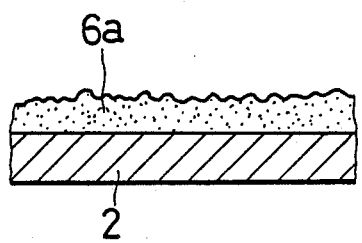
FIG. 3 is an enlarged sectional view showing a fine surface shape of the coating layer.

FIG. 2 is a perspective view illustrating an electronic circuit board 1 with various electronic elements 3 mounted thereon, in which the numeral 2 denotes a substrate (a ceramic substrate will do) formed by impregnating a base material such as glass cloth, mat, non-woven cloth or paper with a phenolic resin, an epoxy resin or a polyester resin in a laminar form, with copper foil bonded to one or both faces thereof. The electronic elements 3 are mounted on the substrate 2 by soldering lead wires thereof through holes formed in the substrate, and an electrical connection is made using a connector 4.

Figure 1:
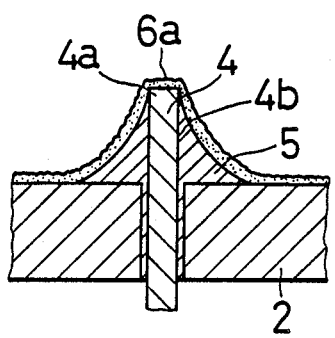
FIG. 1 is a schematic sectional view showing a structure of an insulating coating layer according to example 1 of the present invention.

FIG. 1 is a schematic sectional view of the lead wire soldered portion on the back of the electronic circuit board, in which numeral 4 denotes a lead wire serving as a leg of an element such as an integrated circuit (IC) or a resistor, with an electroconductive edge portion being formed at a top corner 4a or at a side corner 4b in the case of the lead wire being rectangular in section. Numeral 5 denotes solder and numeral 6a denotes an insulating coating layer according to the present invention, the insulating coating layer 6a being formed throughout the substrate 1, including the lead wire soldered portions. The coating layer 6a is formed, for example, by a perfluoroalkylacryl copolymer resin having a high critical surface tension and superior in water repellency. The surface thereof is a rough dotlike-embossed surface (frosted glass-like rough surface) having fine concaves and convexes. More particularly, the surface roughness is approximately 0.1 to 50 μm in terms of $H_{MAX}$ (maximum height) and the pitch between each concave and each convex is in the range of 0.1 to 100 μm. The thickness of the coating layer 6a is about 1 μm and is almost uniform throughout the entirety thereof. That is, the edge portion 4a at the fore end of the lead wire 4 is also covered with the coating layer 6a in about the same thickness as at the other portion.

The following description is now provided about how to form the coating layer 6a.

The perfluoroalkylacryl copolymer resin was obtained by copolymerizing 70-99 wt % of a perfluoroalkylacryl monomer (acrylic acid, methacrylic acid, acrylonitrile or a derivative thereof, or the like having an alkyl group with side chain all substituted by fluorine) and 1-30 wt % of an acryl monomer as another monomer (acrylic acid, methacrylic acid, acrylonitrile, or a derivative thereof). This resin was dissolved in Freon 113 (a product of Du Pont) as a freon solvent at a concentration thereof in the range of 0.1 to 15 wt %.

Then, the solution was applied to the substrate surface according to a known air spray method (aerosolling the solution with a high-pressure air current and spraying the resulting aerosol). The solvent Freon 113 ($Cl_2$ FC-CClF$_2$, a product of Du Pont) dries quickly because its boiling point of 47.6° C. is close to room temperature, so when the solution is applied to the substrate surface by spraying at a certain distance from the substrate, the aerosol adhered to the substrate surface dries and solidifies by vaporization of the solvent before it forms a liquid layer on the same surface, so that the coating layer formed on the substrate surface is a dot-like-embossed surface as mentioned above, which is like a white frosted glass.

Figure 4:
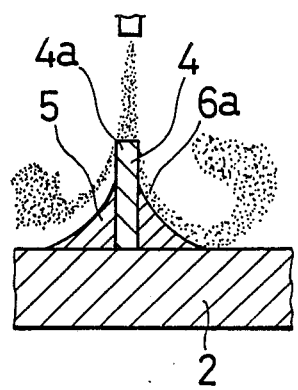
FIG. 4 is an explanatory sectional view showing the state of spraying the aerosol of the coating material onto the electronic circuit board.
Figure 5:
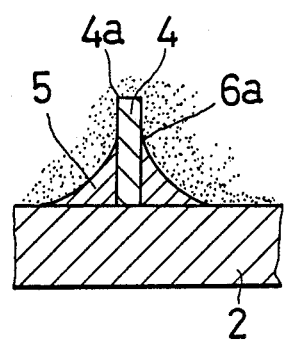
FIG. 5 is an explanatory sectional view showing a state just before adhesion of a coating material onto the electronic circuit board.
Figure 6:
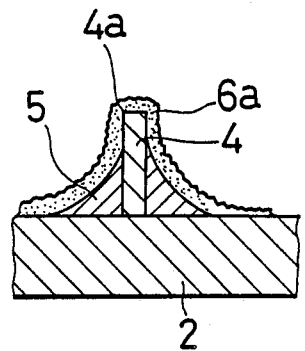
FIG. 6 is an explanatory sectional view showing a state after application of the coating material onto the electronic circuit board.
Figure 7:
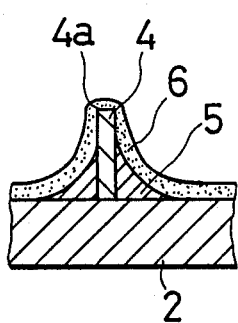
FIG. 7 is an explanatory sectional view showing a state just after application of a conventional insulating coating material.
Figure 8:
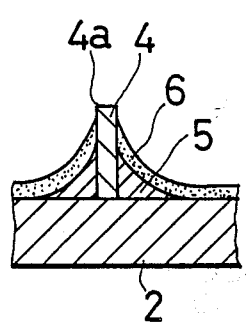
FIG. 8 is an explanatory sectional view showing a somewhat dropped state of the coating material.
Figure 9:
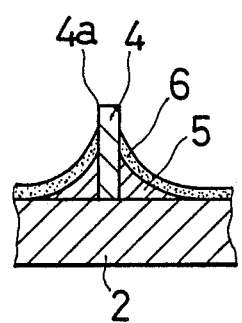
FIG. 9 is an explanatory sectional view showing a considerably dropped state of the coating material.

On the other hand, at the fore end portion of the lead wire 4 having an edge portion, almost simultaneouly with or immediately after the adhesion of the aerosol of the resin solution sprayed as in FIG. 4 to the lead wire surface, the solvent begins to volatilize and dry because of its quick drying property, so that a coating layer is formed in the sprayed state of the aerosol in uniform thickness at both the edge portion 4a and the other portion without the occurrence of such flowing-off phenomenon as shown in FIGS. 8 and 9. This permits the coating layer to be formed thin throughout the entirety thereof, so that there will not occur an internal stress of the coating layer, crack of the soldered portion of each electronic element due to heat shock, or crack of the coating layer due to heat shrinkage. Consequently, disconnection or short-circuit of the electronic circuit will not occur over a long period of time. Moreover, an economic merit is attained because they may be used a smaller amount of the expensive perfluoroalkylacryl copolymer as the starting material for the coating layer. In the above method, a suitable spray distance is in the range of about 20 to about 50 cm although it depends on the amount and concentration of the solution sprayed.

Reference will be made below to the comparison between the present invention and Comparative Examples 1 and 2 with respect to the percent edge coverability and results of an anti-dew condensation test. In Comparative Example 1 a coating layer was formed by a dipping method using a solution of an acrylic resin as a thermoplastic resin in xylene (b.p. 138°-144° C.) as a solvent, and in Comparative Example 2 a coating layer was formed by the same dipping method using a solution of a perfluoroalkylacryl copolymer in Freon 113 (a product of Du Pont). The "percent edge coverability" as referred to herein represents a/b × 100 (%) wherein "a" represents the thickness of the coating layer at the edge portion and "b" represents the coating layer thickness at the other portion. In the anti-dew condensation test, an electronic circuit for testing with an insulating coating layer formed thereon was placed in an atmosphere of −30° C. for 30 minutes, then transferred into an atmosphere of 25° C., 90-95% RH and electricity was supplied to the electronic circuit. This cycle was repeated and whether trouble did not occur over 30 cycles or more was checked.

TABLE 1

| | Resin material | Solvent | How to apply | Thickness of edge portion | Percent edge coverability | Anti-dew condensation test |
|---|---|---|---|---|---|---|
| Comparative Example 2 | Perfluoro-alkylacryl copolymer | Freon 113 | Dip | 1 μm or less | 50% or less | x |
| Comparative Example 1 | Acrylic resin | Xylene | ↑ | ↑ | ↑ | x |
| Present | Perfluoro- | freon 113 | Spray | 1~20 μm | 90~120% | o |

TABLE 1-continued

| | Resin material | Solvent | How to apply | Thickness of edge portion | Percent edge coverability | Anti-dew condensation test |
|---|---|---|---|---|---|---|
| Invention | alkylacryl copolymer | | | | | |

As is apparent from Table 1, the coating layer of the present invention is very high in the percent edge coverability and an outstanding effect is recognized also in the operation of the electronic circuit.

According to experiments and research done by the present inventors, a satisfactory insulating and protecting effect for the electronic circuit is attained when the percent edge coverability is not smaller than 60%, which value can be attained very easily in the method of the present invention due to the quick drying property explained previously. Moreover, since the insulating coating layer obtained in the above working example employs a perfluoroalkylacryl copolymer having a large critical surface energy, the resin per se has a high water repellency. Further, its surface is a rough dotlike-embossed surface having fine concaves and convexes, so even when water drops adhere thereto, the area of contact with the water drops will be very small, that is, the water repellency is improved. Consequently, the edge portion covered generally uniformly throughout the entirety thereof is improved in its insulating property.

EXAMPLE 2

Figure 12:
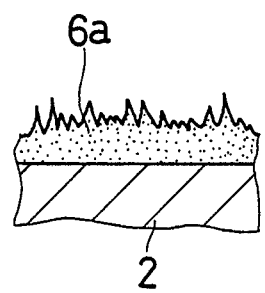
FIG. 12 is an enlarged sectional view of the insulating coating layer shown in FIG. 11.
Figure 13:
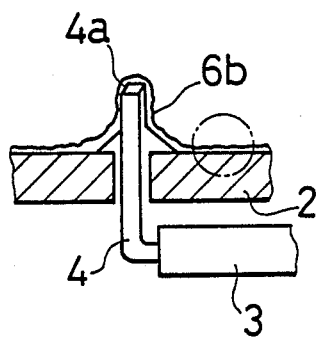
FIG. 13 is a schematic sectional view showing a structure of an insulating coating layer resulting from heat treatment of the insulating coating layer shown in FIG. 11.
Figure 14:
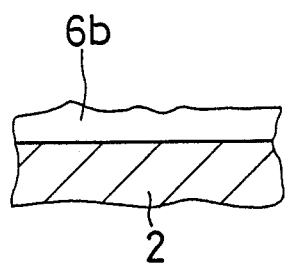
FIG. 14 is an enlarged sectional view of the insulating coating layer shown in FIG. 13.

The coating layer 6a formed in the above working example has a very high water repellency because of a dotlike-embossed surface thereof as mentioned above, while on the other hand letters printed on electronic elements, etc. are difficult to discriminate because of the white color of the surface, and the fine concaves and convexes at an upper portion of the coating layer 6a are weak against external physical forces. In view of this point the following working example has a step of heating the dotlike-embossed coating layer 6a, for example, at a temperature of 60° to 80° C. for 10 to 20 minutes, as illustrated in FIG. 12, in addition to the manufacturing process for the coating layer 6a in the above working example. More particularly, by suitably adjusting the heating temperature and time, mainly the fine concaves and convexes alone on the surface of the dotlike-embossed coating layer 6a can be softened and melted to flatten the surface and form a coating layer 6b without melting the portion on the side of the substrate 2 and lead wire 4 of the dotlike-embossed coating layer 6a and hence without causing flow of the coating layer 6a. The heating temperature and time are determined according to cases. If the components mounted on the substrate 2 are of a high heat resistance, it is possible to form the coating layer 6b at a higher temperature in a shorter time. As to the range of the heating temperature, in the case of this working example it can be considered that the softening point of perfluoroalkylacryl monomer, which is in the range of about 60° to 70° C., is a lower limit and the temperature at which weight loss occurs by heating, which is about 150 C., is an upper limit.

The following is an explanation of another working example of a method for forming the flattened coating layer 6b. Also in this example the process up to the formation of the dotlike-embossed coating layer 6a may be the same as in the previous example, so an explanation thereon will be omitted. This working example is characterized in that, in order to flatten the surface of the dotlike-embossed coating layer 6a, the substrate 2 with the coating layer 6a formed thereon is held in a vapor atmosphere of Freon 113 (a product of Du Pont) as a fluorine-based solvent for a predetermined time. Since the coating layer 6a is held in such vapor atmosphere, not dipped in a solution of Freon 113 (a product of Du Pont), mainly the fine concaves and convexes alone on the surface are melted without melting the portion on the side of the substrate 2 and lead wire 4 of the dotlike-embossed coating layer 6a, whereby the surface of the coating layer can be made flat to the same extent as in the previous working example in which the coating layer surface is heated for the melting. According to an experiment conducted by the present inventors, when a substrate 2 of approximately 15 cm by 15 cm was held in a vapor atmosphere of Freon 113 (a product of Du Pont) for 0.1 to 5 seconds, only fine concaves and convexes were melted to a satisfactory extent to afford a transparent coating layer 6.

Figure 10:
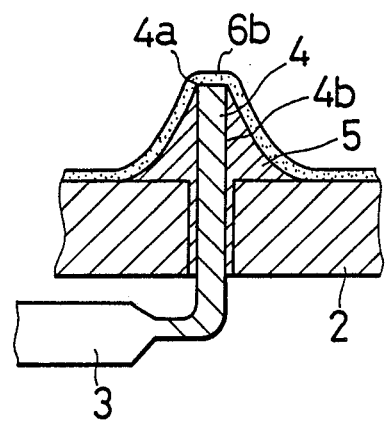
FIG. 10 is a schematic sectional view showing a structure of an insulating coating layer according to example 2 of the present invention.
Figure 11:
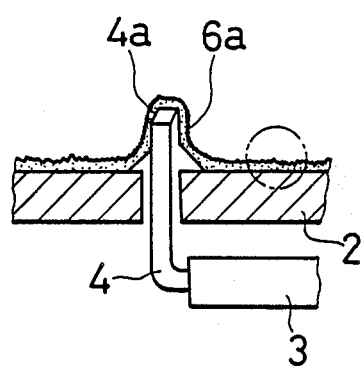
FIG. 11 is a schematic sectional view showing a structure of an insulating coating layer formed in example 2.

FIG. 10 is a schematic sectional view of the insulating coating layer 6b obtained by the above working example involving either heating the substrate or holding it in a vapor atmosphere of a fluorine-based solvent. In the figure, the insulating coating layer 6b is transparent, having a surface roughness not larger than about 20 μm in terms of $H_{MAX}$, and its thickness is almost uniform throughout the entirety thereof. On both the edge portion 4a at the fore end of the lead wire 4 and the other portion the coating layer is formed in about the same thickness.

In view of the purpose of insulation it is to be understood that the range of almost equal or about the same thickness as referred to herein includes a fairly wide range of 50% to 150% in terms of percent edge coverability.

Examples of resin employable in the present invention include, in addition to the perfluoroalkylacryl copolymer used in the above working example, acrylic resins and other thermoplastic resins having water repellency. As the main solvent there may be used any of various solvents capable of dissolving the above resins, boiling not higher than 80° C. and affording a quick drying property upon spray of the solution.

As the spray there may be adopted airless spray in addition to air spray using high pressure air.

As examples of the edge portion having electroconductivity in the present invention there are mentioned electroconductive edge portions of chip elements as well as fore end or side portions of lead wires in the above working examples.

EXAMPLE 3

The insulating coating material for an electronic circuit board according to the present invention is characterized in that it is a solution comprising a thermoplastic resin and a mixed solvent for dissolving the thermoplastic resin and that the said mixed solvent comprises a main solvent capable of dissolving the thermoplastic resin and having a boiling point not higher than 100° C. at 760 mmHg and a secondary solvent compatible with and boiling higher than the main solvent.

The above thermoplastic resin, which is used for the formation of an insulating coating for an electronic circuit board, is not specially limited if only it is dissolved in the mixed solvent as will be described below. Examples are acrylic resins and other resins having water repellency, in addition to perfluoroalkylacryl copolymers. Above all, perfluoroalkylacryl copolymers are preferred. This is because they can afford a coating superior in insulating property, water repellency, adhesion and appearance.

The main solvent is of a relatively low boiling point and a relatively large volatility. The mixed solvent contains a secondary solvent compatible with and boiling higher than the main solvent. It does not matter whether the secondary solvent dissolves the resin used or not, if only it is compatible with the main solvent. However, in the case of using a secondary solvent not dissolving the resin, it is preferable that its proportion be small or that it be azeotropic with the main solvent. This is for preventing whitening of the coating layer with volatilization of the main solvent. The secondary solvent is for adjusting the drying property of the mixed solvent in a range capable of maintaining a high edge coverability and determining a well-balanced solvent composition range.

It is preferable for the main solvent to have a relatively large volatility. For example, the main solvent has a boiling point not higher than 50° C. at 760 mmHg. The main solvent and the secondary solvent are determined in correlation with the thermoplastic resin used, but in the case of using a fluoric resin which is preferred as the thermoplastic resin, it is preferable that the main solvent be a fluorine-based solvent and the secondary solvent be a fluorine-based solvent alone or a solvent containing a fluorine-based solvent. Preferably, the secondary solvent consists of first and second secondary solvents which are compatible with the main solvent and compatible with each other. As the second secondary solvent there may be used a solvent which does not dissolve the resin used. The main solvent-secondary solvent mixing ratio is preferably 0.1-20 parts by weight of the secondary solvent per 100 parts by weight of the main solvent. Preferably, the solution as the insulating coating material has a resin concentration in the range of about 0.1 to 15 wt %. In this case, the solution usually has a viscosity (as measured using a B-type viscosimeter) in the range of about 1 cp to about 50 cp. The resin concentration and the solution viscosity vary depending on the kind of resin used, degree of polymerization, etc.

When the insulating coating material or solution is sprayed onto the surface of an electronic circuit board with electronic elements mounted thereon, it is preferable that the resin concentration in the solution just before or after the application be in the range of 20 to 30 wt % and that the viscosity (as measured using a B-type viscosimeter) of the resin solution just before or after the application be in the range of 50 cp to 100 cp. These are for preventing dropping of the solution after its application onto the substrate surface and thereby forming a generally uniform coating layer.

As an application method other than the spray method there also may be used a dipping method or a brush coating method for the insulating coating material according to the present invention.

Examples of the edge portion having electroconductivity in the present invention include fore end and side portions of lead wires as well as electroconductive edge portions of chip elements.

The method for forming an insulating coating layer for an electronic circuit board, according to the present invention, is characterized by spraying a solution comprising a thermoplastic resin and a mixed solvent onto the surface of an electronic circuit board with electronic elements mounted thereon, the mixed solvent comprising a main solvent capable of dissolving the thermoplastic resin and having a boiling point not higher than 100° C. at 760 mmHg and a secondary solvent compatible with and boiling higher than the main solvent, and then drying the solution to form an insulating coating layer in which the thickness at edge portions having electroconductivity on the circuit board and the thickness at the other portion than the edge portions are almost equal to each other.

In this method, where the solution is applied by spraying onto the surface of the electronic circuit board with electronic elements mounted thereon, it is preferable that the viscosity (as measured using a B-type viscosimeter) of the solution just before or after the application be in the range of about 50 cp to about 100 cp.

The thermoplastic resin and the mixed solvent used in this method may be the same as those explained previously. In this method, moreover, the resin concentration in the solution just after application onto the surface of the electronic circuit board may be in the range of 15 to 50 wt %. The application of the solution may be done using a known air spray method (aerosolling the solution using a high pressure air current and spraying the resultant aerosol). In place of the high pressure air spray method there may be adopted an airless spray method. The spray distance is preferably in the range of about 20 to about 50 cm although it depends on the amount and concentration of the solution sprayed.

The method for forming the insulating coating layer for an electronic circuit board is not limited to the spray method. There may be adopted a dipping method. According to a dipping method, an electronic circuit board is dipped into such a predetermined solution as mentioned above, then the circuit board is pulled up from the solution to apply the solution onto the surface of the circuit board and the solution is then dried to form a predetermined coating. In this case, the circuit board may be pulled up directly from the solution, or a tank containing the solution may be pulled down by means of a lifter or the like to pull up the circuit board from the solution in a relative manner.

It is preferable that the viscosity of the solution just after pulling up the circuit board from the solution be in the range of 50 to 100 cp. This is for preventing the solution from dropping just after pulling up from the solution to thereby make the coating thickness at edge portions on the circuit board and the coating thickness at the other portion than the edge portions almost equal to each other.

The present invention will be described below on the basis of concrete working examples. In the method used in the above Example 2 it is necessary to perform a post-treatment for flattening the coating. On the other hand, in Example 3, the above object can be attained without requiring such post-treatment.

As the thermoplastic resin there was used a perfluoroalkylacryl copolymer resin which had been obtained by copolymerizing 70–99 wt % of a perfluoroalkylacryl monomer (acrylic acid, methacrylic acid, acrylonitrile or a derivative thereof having an alkyl group with side chain all substituted by fluorine) and 1–30 wt % of an acryl monomer as another monomer (acrylic acid, methacrylic acid, acrylonitrile, or a derivative thereof).

As the main solvent there was used Freon 113 (a product of Du Pont) having a good compatibility with the above resin and a very superior quick drying property. As the secondary solvent there may be used any of the following three solvents. The first is a solvent (especially a fluorine-based solvent) boiling higher than Freon 113 (a poduct of Du Pont) and capable of dissolving the above fluoric resin. The second is a solvent (especially a solvent azeotropic with Freon 113 (a product of Du Pont) and not dissolving the fluoric resin) having a high boiling point and compatible with Freon 113 (a product of Du Pont). The third one is a binary solvent consisting of the first and second solvents.

According to experiments conducted by the present inventors, m-xylene hexafluoride (m-XHF, boiling point 110° C.) is effective as a secondary solvent capable of dissolving the above resin. This is because m-XHF is superior not only in dissolving fluoric resins but also in suppressing the volatility of the main solvent moderately. High boiling organic solvents compatible with Freon 113 (a product of Du Pont) are shown in Table 2. Various such solvents are existent as shown therein, but ethanol (b.p. 67° C.) is considered suitable in view of its low toxicity, low cost, suitable boiling point, azeotropic characteristic and suitability for electronic components.

The following resin solutions were prepared in consideration of the above.

TABLE 2

| Dissolve completely | Dissolve very well | Dissolve well | Dissolve a little |
|---|---|---|---|
| Acetone | Azobenzene | Acetanilide | Acetamide |
| Carbon tetrachloride | Camphor | Benzoic acid | Gelatin |
| Benzene | Benzophenone | Benzyl | Anthracene |
| Chloroform | Cocoa butter | Diphenyl | Lactic acid |
| Ether | Cottonseed oil | Diphenylcarbinol | Iodoform |
| Methanol | Naphthalene | Ester gum | Phenol |
| Ethanol | Thiobromine | Fthyl bromide | Salicylic acid |
| Hexane | Thymol | Hexachloroethane | Sulfonal |
| Kerosene | Tribromophenol | Phthalic anhydride | Tartaric acid |
| Mineral oil | | Stearic acid | Urea |

The resin concentration was adjusted to about 2 wt % using as a solvent Freon 113 (a product of Du Pont) and m-XHF in Run 1, Freon 113 (a product of Du Pont) and ethanol in Run 2, Freon 113, mXHF and ethanol in Run 3, and Freon 113 (a product of Du Pont) alone in Comparative Run 1.

The above resin solutions were sprayed under the following conditions. Results are as set out in Table 3.

(Spray Conditions)

Airless spray (a spraying method by which an oblong sprayed portion is obtained)
Spray distance: 20–30 cm
Pattern width: 15–20 cm
Moving rate of the gun or substrate: 100 cm/min.

In Run 1, at an optimum ratio of the main solvent to the secondary solvent in the range of 20/1 to 5/1, there was exhibited a very good result in the improvement of adhesion although the quick drying property and the edge coverability were somewhat inferior. That is presumed to be because the volatilization of the mixed solvent was suppressed to some extent due to a relatively high boiling point (110° C.) of the secondary solvent in comparison with the main solvent and also because the secondary solvent dissolved the fluoric resin.

In Run 2, since the boiling point 67° C. of the secondary solvent is of a medium degree and an azeotropic mixture with Freon 113 (a product of Du Pont) is constituted, there are attained easy handleability, quick drying property and good edge coverability. However, the improvement of adhesion is somewhat inferior to that in Run 1 because the secondary solvent in Run 2 does not have a dissolving power for the resin. In Run 3, possessing both the merit of Run 1 and that of Run 2, the best performance was exhibited in an appropriate balance of the mixed main-secondary solvent system.

The amount of the solvent components to be added varies according to amount of resin or spray conditions, etc., so it is necessary to determine it case by case. As examples of secondary solvent components: acetone, hexane, methanol, other alcohols, xylene, ether and benzene. Also effective as a fluorine-based solvent is tetrachlorodifluoroethane.

Table 4 shows the results of an anti-dew condensation test for electronic circuits which have been subjected to spray treatments (air spray or airless spray method) using the above coating agents. In Comparative Run 2 there was performed a dipping treatment using an acrylic resin as a thermoplastic resin and xylene as a mixed solvent, not containing a secondary solvent. In the anti-dew condensation test, an electronic circuit for test having an insulating coating layer formed thereon was allowed to stand in an atmosphere of −30° C. for 30 minutes and thereafter transferred into an atmo-

TABLE 3

| | Coating Appearance | Adhesion | Quick drying property | Edge coverability | Water repellency |
|---|---|---|---|---|---|
| Run 1 | Good | Very good | Somewhat slow | Somewhat poor | Somewhat poor |
| Run 2 | Good | Good | Good | Good | Good |
| Run 3 | Good | Very good | Good | Good | Good |
| Comparative Run 1 | White | Somewhat poor | Good | Good | Very good | sphere of 25° C., 90–95% RH, then the electronic circuit was supplied with electricity followed by checking, and this cycle was repeated. The maximum number of cycles was set to ten. A look at the results shows that in Runs 2 and 3 there was attained an extremely good anti-dew condensation performance without causing deterioration in the supply of electricity even after ten cycles.

TABLE 4

| Number of cycles | 2 | 4 | 6 | 7 | 8 | 9 | 10 |
|---|---|---|---|---|---|---|---|
| Run 1 | o | o | o | | o | o | x |
| Run 2 | o | o | o | | o | | o |
| Run 3 | o | o | o | | o | | o |
| Comparative Run 1 | o | o | o | | o | | o |
| Comparative Run 2 | o | o | o | x | | | |

Particularly, according to experiments conducted by the present inventors, an extremely good result was obtained by using a resin solution which had been prepared by adding 3–8 parts by weight of m-XHF and 2–5 parts by weight of ethanol to a resin solution consisting of 2 parts by weight of solid resin and 98 parts by weight of Freon 113 (a product of Du Pont). The use of this coating material was also effective in preventing bubbling during not only spray treatment but also dipping treatment.

(Effect of the Invention)

According to the present invention, as set forth hereinabove, on an electronic circuit board having electroconductive edge portions and projections there is formed an insulating coating layer in which the thickness at the edge portions and that at the portion other than the edge portions are almost equal to each other, whereby it is made possible to provide an electronic circuit board having a high insulating property against dew condensation.

Moreover, by flattening fine concaves and convexes formed on the coating layer surface, the resistance to external physical forces can be enhanced and it is possible to render the said surface transparent, thus resulting in easy differentiation between Nos. of electronic elements, resister color, etc. and resistance can be obtained against the contact of operator's hand, jig, etc.

The mixed solvent used in the insulating coating material for an electronic circuit board is characterized by comprising a main solvent capable of dissolving a thermoplastic resin and having a boiling point not higher than 100° C. at 760 mmHg and a secondary solvent compatible with and boiling higher than the main solvent, the main solvent having a relatively large volatility and the secondary solvent suppressing the volatility of the main solvent moderately. Therefore, when such insulating coating material is applied to the circuit board surface by a spray method or a dipping method, especially by the former, it is possible to attain through, for example, a simple spray treatment an insulating coating layer of high functions having high water repellency, quick drying property, high edge coverability and high adhesion. Further, coupled with the high water repelling effect of the resin itself used, there is attained an outstanding water repelling effect especially in the case of using a fluorine-contained resin; that is, a practical effect is exhibited as an excellent moisture-proof coating material for an electronic circuit board.

Additionally, in the method for forming such insulating coating layer according to the present invention, when the above insulating coating material is applied by spraying or dipping onto the surface of an electronic circuit board, the coating solution just before or after the application scarcely drops, so upon drying of the solution the coating thickness at edge portions and that at the other portion become almost equal to each other, thus permitting the pin edge portions to be coated to a sufficient extent.

Besides, when the insulating coating material of the present invention is used for forming the insulating coating layer, the quick drying property thereof is suppressed by the secondary solvent, so that an appropriate drying speed is obtained, affording a highly transparent coating appearance.

Having now fully described the invention, it will be apparent to one of ordinary skill in the art that many changes and modifications can be made thereto without departing from the spirit or scope of the invention as set forth herein.

I claim:

1. An insulating coating material for an electronic circuit board consisting essentially of a fluorinated thermoplastic resin and a mixed solvent for dissolving said fluorinated thermoplastic resin, said mixed solvent comprising a main solvent and a secondary solvent, said main solvent comprising 1,1,2-trichloro-1,2,2-trifluoroethane (bp. 47° C.), and said secondary solvent being compatible with and having a higher boiling point than said main solvent.

2. An insulating coating material for an electronic circuit board according to claim 1, wherein said secondary solvent has a boiling point greater than 100° C.

3. An insulating coating material for an electronic circuit board according to claim 1, wherein said secondary solvent is m-xylene hexafluoride (bp. 113° C.).

4. An insulating coating material for an electronic circuit board according to claim 3, wherein the content of said secondary solvent consists of 0.1 to 20 weight parts per 100 weight parts of said main solvent, and the content of said fluorinated thermoplastic resin is in the range of from 0.1 to 15 wt % of said insulating coating material.

5. An insulating coating material for an electronic circuit board according to claim 3, wherein said fluorinated thermoplastic resin is a perfluoroalkylacryl copolymer resin.

6. An insulating coating material for an electronic circuit board according to claim 5, wherein said perfluoroalkylacryl copolymer resin comprises of from 70 to 99 wt % of perfluoroalkylacryl monomer, and from 1 to 30 wt % of an acryl monomer.

7. An insulating coating material for an electronic circuit board according to claim 6, wherein said perfluoroalkylacryl monomer is selected from the group consisting of perfluoroacrylic acid, perfluoromethacrylic acid, perfluoroacrylonitrile and derivatives thereof, and said acryl monomer is selected from the group consisting of acrylic acid, methacrylic acid, acrylonitrile and derivatives thereof.

8. An insulating coating material for an electronic circuit board according to claim 3, wherein said coating material has a viscosity in the range of from about 1 cp to about 50 cp.

9. An insulating coating material for an electronic circuit board according to claim 3, wherein said secondary solvent is capable of dissolving said fluorinated thermoplastic resin.

10. An insulating coating material for an electronic circuit board according to claim 3, wherein said secondary solvent is not capable of dissolving said fluorinated thermoplastic resin.

11. An insulating coating material for an electronic circuit board according to claim 1, wherein said secondary solvent is ethanol (bp. 67° C.).

12. An insulating coating material for an electronic circuit board consisting essentially of a mixture of a fluroinated thermoplastic resin and a mixed solvent for dissolving said fluorinated thermoplastic resin, said mixed solvent comprising a main solvent and a first and a second secondary solvent, said main solvent comprising 1,1,2-trichloro-1,2,2-trifluoroethane (bp. 47° C.), said first secondary solvent being compatible with and having a higher boiling point than said main solvent, and said first secondary solvent being capable of dissolving said fluorinated thermoplastic resin, said second secondary solvent being compatible with and having a higher boiling point than said main solvent, and said second secondary solvent not being capable of dissolving said fluorinated thermoplastic resin.

13. An insulating coating material for an electronic circuit board according to claim 12, wherein said first secondary solvent is m-xylene hexafluoride (bp. 113° C.) and said second secondary solvent is ethanol (bp. 67° C.).

14. An insulating coating material for an electronic circuit board consisting essentially of a fluorinated thermoplastic resin and a mixed solvent for dissolving said fluorinated thermoplastic resin, said mixed solvent comprising a main and a secondary solvent, said main solvent comprising 1,1,2-trichloro-1,2,2-trifluoroethane (bp. 47° C.), said secondary solvent being compatible with and having a higher boiling point than said main solvent, and said secondary solvent being capable of dissolving said fluorinated thermoplastic resin.

15. An insulating coating material for an electronic circuit board consisting essentially of a mixture of a fluorinated thermoplastic resin and a mixed solvent for dissolving said fluorinated thermoplastic resin, said mixed solvent comprising of a main solvent and a secondary solvent, said main solvent comprising 1,1,2-trichloro-1,2,2-trifluoroethane (bp. 47° C.), and said secondary solvent being compatible with and having a higher boiling point than said main solvent, said secondary solvent not being capable of dissolving said fluorinated thermoplastic resin.

* * * * *